United States Patent [19]
Kuo

[11] Patent Number: 6,157,180
[45] Date of Patent: Dec. 5, 2000

[54] POWER SUPPLY REGULATOR CIRCUIT FOR VOLTAGE-CONTROLLED OSCILLATOR

[75] Inventor: James R. Kuo, Cupertino, Calif.

[73] Assignee: National Semiconductor Corporation, Santa Clara, Calif.

[21] Appl. No.: 09/262,391

[22] Filed: Mar. 4, 1999

[51] Int. Cl.[7] .............................. G05F 1/40; G05F 3/20
[52] U.S. Cl. ..................... 323/282; 323/313; 323/315
[58] Field of Search ................................. 323/282, 312, 323/313, 268, 267, 314, 315; 327/237, 108; 331/57

[56] References Cited

U.S. PATENT DOCUMENTS

| | | | |
|---|---|---|---|
| 4,547,741 | 10/1985 | Katakura | 330/149 |
| 5,175,512 | 12/1992 | Self | 331/57 |
| 5,661,428 | 8/1997 | Li et al. | 323/313 |
| 5,739,678 | 4/1998 | Nagaraj | 323/268 |

*Primary Examiner*—Peter S. Wong
*Assistant Examiner*—Rajnikant Patel
*Attorney, Agent, or Firm*—Baker & McKenzie

[57] ABSTRACT

A power supply regulator circuit with increased rejection of variations and noise in power supply voltage which is particularly well suited to isolating a voltage-controlled oscillator (VCO) from such power supply variations and noise. The regulator circuit uses an operational amplifier connected as a voltage follower circuit to buffer the reference voltage provided as the regulated supply potential for the VCO. This buffered voltage is also used to establish the bias voltage across a current mirror circuit which is powered by the unregulated power supply and through which the supply current for the VCO flows. This circuit topography requires no compensation capacitance and, therefore, provides increased rejection of variations and noise in the power supply voltage.

17 Claims, 13 Drawing Sheets

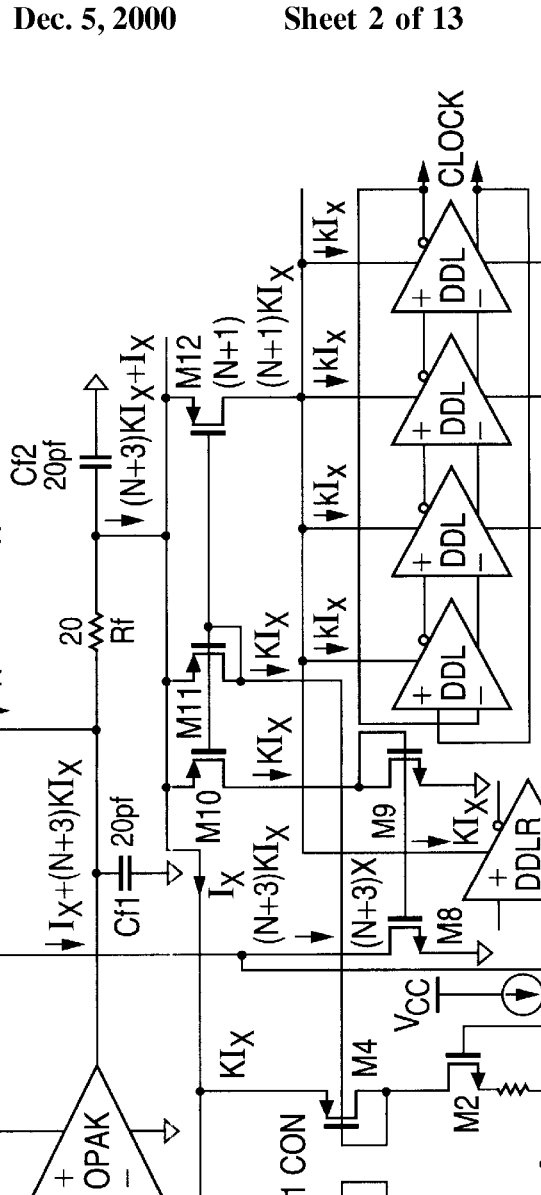
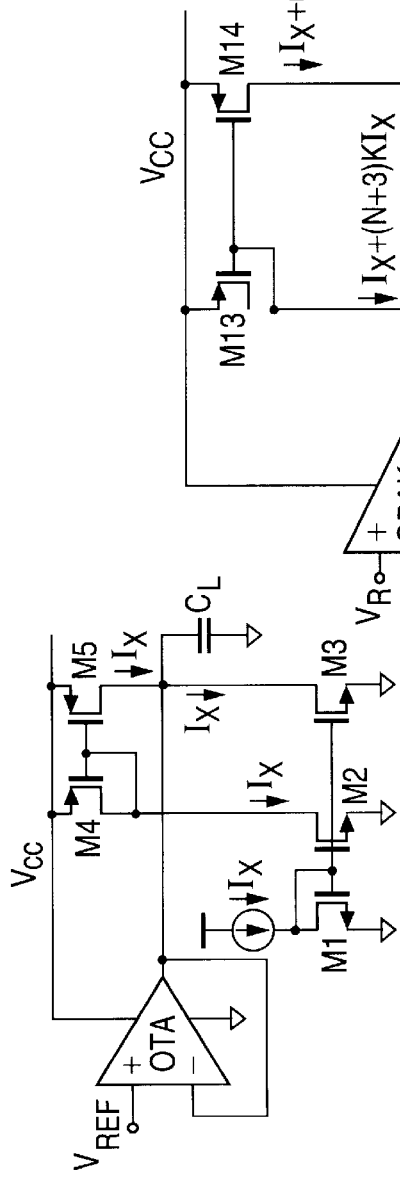
FIGURE 5
FIGURE 4

POWER SUPPLY REGULATOR CIRCUIT FOR VOLTAGE-CONTROLLED OSCILLATOR

BACKGROUND OF THE INVENTION

1. Field of the Invention

The present invention relates to power supply regulator circuits, and in particular, to power supply voltage regulator circuits particularly suitable for voltage-sensitive circuits such as voltage-controlled oscillators.

2. Description of the Related Art

In circuits for high speed data communications, the high frequency phase-locked loop (PLL) is a critical component and requires low jitter. For example, a physical layer performing according to the IEEE 1394A standard when outputting serial data at the rate of 400 megabytes per second requires extremely low jitter (less than 100 picoseconds) within its clock signal for encoding and decoding the data.

For integrated circuits using complementary metal oxide semiconductor (CMOS) technology, there are three major sources of jitter within the clock signal. The first source is variations in the power supply voltage which, in turn, cause variations in the operating frequency of the voltage-controlled oscillator (VCO). This is often a dominant source of long term jitter. Accordingly, it is important that both AC and DC power supply rejection be as high as possible.

A second source is transistor band-limited thermal noise in the VCO. Clock jitter can result from the tracking and suppressing by the PLL of the noise at frequencies within the PLL loop bandwidth.

A third source is dI/dt noise induced onto the power supply and ground lines due to current fluctuations caused by switching of the CMOS logic. This often appears as cycle-to-cycle, or multiple-cycle, accumulated short term clock jitter.

Referring to FIG. 1, a PLL with a VCO can be modeled in the s-domain with a functional block diagram as shown. As indicated, the output phase noise $\theta o$ is the result of the sum of effects of various sources of phase noise, including internal sources $\theta ni$, $\theta no$ and an external source in the form of noise Vccn on the power supply voltage Vcc. This injected noise voltage Vccn is affected according to a transfer function identified as Hn(s), the output of which is added to the output voltage Vcnt from the loop filter Zf(s). This noise is then filtered by the voltage-to-phase band-pass characteristic Gbp(s). This is represented below in Equations 1, 2 and 3.

$$\theta o = \frac{\frac{Kv}{s}\left(\frac{IpZf(s)}{2\pi}\right)(\theta i + \theta ni)}{1+D(s)} + \frac{\frac{Kv}{s}Hn(s)Vccn}{1+D(s)} + \frac{\theta no}{1+D(s)} \quad (1)$$

$$Zf(s) = \frac{sRCp+1}{s\left[\frac{sRCp}{\left(1+\frac{Cp}{c}\right)}+1\right](c+Cp)} \quad (2)$$

$$D(s) = \frac{RKvIpZf(s)}{sN(2\pi)} \quad (3)$$

If it is assumed that the external noise Vccn is dominant and the internal noise $\theta ni$, $\theta no$ can be assumed negligible, i.e., equal to zero, this allows Equation 1 to be simplified to Equation 4 (with $\theta i = 0$).

$$\theta o = \frac{-KvHn(s)(c+Cp)s\left[\frac{sRCp}{\left(1+\frac{Cp}{c}\right)}+1\right]Vccn}{(c+Cp)s^2\left[\frac{sRCp}{\left(1+\frac{Cp}{c}\right)}+1\right]+\frac{RKvIp}{2\pi N}(sRCp+1)} \quad (4)$$

$$= Gbp(s)Hn(s)Vccn$$

According to Equation 4, the zero at the origin (due to the factor "s" in the numerator of Equation 4) indicates that for slow variations in the injected noise voltage Vccn (as well as any variations in its associated transfer function Hn(s)), the output noise $\theta o$ is small. If, however, the rate of Vccn*Hn(s) increases, the gain of the VCO (kVCO/s) and, hence, the loop gain, decreases. This results in the loop error and, therefore, the loop noise, increasing. As the rate of change of Vccn*Hn(s) approaches $\omega z = (1+Cp/C)/RCp$, the loop gain is reduced by the low-pass loop filter as well. This effect is represented by the transfer function zero at $-(1+Cp/C)/RCp$. Since $(1+Cp/C)$ is determined by the loop bandwidth and its stability, the high frequency zero can be slightly increased by raising the value of the capacitor C. Therefore, reduction in the voltage supply noise must be achieved by some other technique.

Referring to FIG. 2, one conventional technique to reduce noise from the power supply voltage involves regulating the power supply voltage Vcc through a regulator circuit as shown. The VCO is a conventional ring oscillator composed of a selected number of inverters and is powered through a voltage-to-current converter in the form of a current mirror circuit M7, M8 powered by a regulated voltage source Vvco. This voltage Vvco is regulated by an operational amplifier (op amp) OTA driving a P-MOS transistor M5 amplifier, both of which are powered by the raw power supply voltage Vcc. The reference voltage Vref driving the op amp OTA determines the regulated voltage Vvco. A compensation capacitor $C_C$ provides frequency compensation for the amplifier M5. The output voltage Vf from a charge pump circuit (not shown) is filtered and drives an N-MOS transistor M6 amplifier and thereby determines the input current for the current mirror circuit M7, M8. A filter capacitor $C_L$ filters the regulated voltage Vvco.

Referring to FIG. 3, the op amp OTA is shown in more detail. As can be seen, since the combination of the op amp OTA and the amplifier M5 provide two gain stages for supplying the load current $I_L$ to the VCO, frequency compensation is required due to the unity gain configuration. In order to achieve a phase margin of 65°, the compensation capacitance $C_C$ must have a value which is at least 0.22 times the value of the filter capacitance $C_L$. This requirement is illustrated below by Equations 5–10. Such a high relative value of capacitance for the compensation capacitor $C_C$ reduces the amount of power supply rejection available from such a circuit configuration.

$$GBW = \frac{-g_{M1}}{C_C} \quad (5)$$

$$W_{ND} = \frac{-g_{M5}}{C_L} \quad (6)$$

$$W_Z = \frac{+g_{M5}}{C_C} \quad (7)$$

-continued $$\frac{g_{M5}}{C_C} \geq \frac{10 g_{M1}}{C_C} \quad (8)$$

$$\frac{g_{M5}}{C_L} \geq \frac{2.2 g_{M1}}{C_C} \quad (9)$$

$$C_C \geq 0.22 C_L \quad (10)$$

SUMMARY OF THE INVENTION

A power supply regulator circuit with increased rejection of variations and noise in power supply voltage in accordance with the present invention provides a regulated voltage output with significantly increased rejection of AC and DC variations and induced switching noise within the power supply voltage. A simplified circuit topology is used in which a unity gain buffer amplifier which requires no compensation capacitance is used to drive a current mirror circuit which, in turn, provides the load current for the circuit whose power supply voltage is being regulated.

In accordance with one embodiment of the present invention, a power supply regulator circuit with increased rejection of variations and noise in power supply voltage includes a power supply terminal, a regulated circuit terminal, a current replication circuit and a voltage buffer circuit. The power supply terminal is configured to couple to a power supply and convey therefrom a supply voltage and a supply current. The regulated circuit terminal is configured to convey a regulated voltage and a first current. The current replication circuit is coupled between the power supply and regulated circuit terminals and is configured to receive the supply current and the regulated voltage and in accordance therewith provide the first current and a second current, wherein the first and second currents are substantially mutually proportional. The voltage buffer circuit is coupled to the regulated circuit terminal and is configured to receive and buffer a reference voltage and in accordance therewith provide the regulated voltage. Variations and noise in the supply voltage appear across the current replication circuit and are thereby substantially prevented from appearing in the regulated voltage.

In accordance with another embodiment of the present invention, a voltage-controlled oscillator with increased rejection of variations and noise in power supply voltage includes a power supply terminal, a regulated circuit terminal, a current mirror circuit, a voltage buffer circuit and a voltage-controlled oscillator circuit. The power supply terminal is configured to couple to a power supply and convey therefrom a supply voltage and a supply current. The regulated circuit terminal is configured to convey a regulated voltage and a first current. The current mirror circuit is coupled between the power supply and regulated circuit terminals and is configured to receive the supply current and the regulated voltage and in accordance therewith provide the first current and a second current, wherein the first and second currents are substantially mutually proportional. The voltage buffer circuit is coupled to the regulated circuit terminal and is configured to receive and buffer a reference voltage and in accordance therewith provide the regulated voltage. The voltage-controlled oscillator circuit is coupled to the regulated circuit terminal and is configured to receive the regulated voltage, the first current and a control voltage and in accordance therewith provide an oscillator signal with a frequency that varies in relation to the control voltage. Variations and noise in the supply voltage appear across the current mirror circuit and are thereby substantially prevented from appearing in the regulated voltage.

These and other features and advantages of the present invention will be understood upon consideration of the following detailed description of the invention and the accompanying drawings.

BRIEF DESCRIPTION OF THE DRAWINGS

FIG. 4 is a circuit diagram of a voltage regulator circuit in accordance with one embodiment of the present invention.

FIG. 5 is a circuit diagram illustrating the use of the voltage regulator circuit of FIG. 4 for regulating the power supply voltage for a VCO in accordance with another embodiment of the present invention.

DETAILED DESCRIPTION OF THE INVENTION

Figure 1:
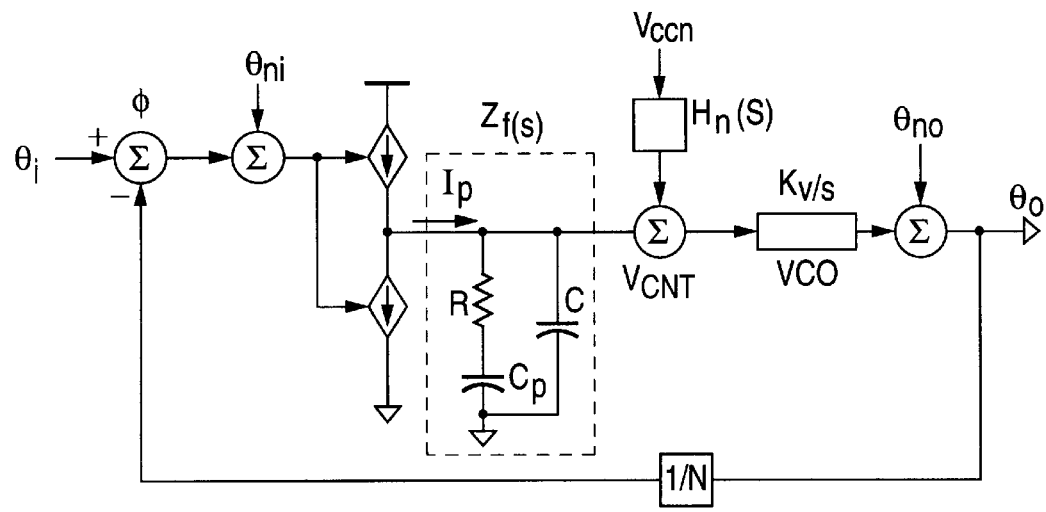
FIG. 1 is a diagram depicting a conventional circuit model for a phase-locked loop (PLL).

Referring to FIG. 4, a power supply regulator circuit with increased rejection of variations and noise in power supply voltage in accordance with one embodiment of the present invention includes a current mirror circuit M4, M5 powered by the raw power supply voltage Vcc and controlled, or biased, by an operational amplifier (op amp) OTA. With the op amp OTA connected in a unity gain configuration, its input reference voltage Vref also appears at the drain terminal of the output transistor M5 of the current mirror circuit. Transistors M4 and M5 each conduct a source current Ix from the power supply which serves as the load current. Hence, the load current for the op amp is substantially zero. Accordingly, in its unity gain configuration, the op amp OTA, which is acting as a buffer amplifier, requires no compensation capacitance. This results in a power supply rejection performance characteristic which is inherently better.

Referring to FIG. 5, the power supply regulator circuit of FIG. 4 is particularly suitable for providing a regulated voltage with good power supply rejection for a voltage controlled oscillator (VCO). In this case, the VCO is implemented using a current controlled oscillator (ICO) in the form of a ring oscillator composed of differential delay lines (DDL), a current source circuit M6–M12, and a voltage-to-current conversion circuit (V/I CON) M1–M5. The ICO is a ring oscillator of conventional design, with each of the DDLs receiving a supply current of kIx. Depending upon the desired frequency of oscillation and various well-known design parameters, the ICO uses N stages of DDLs.

Transistor M6 receives and conducts a current Ix from a current source which is mirrored in transistor MS (discussed in more detail below) and transistor M7. The sum of this current Ix through transistor M7 and the current (N+3)kIx through transistor M8 (which has a channel width of (N+3) times the channel width of transistor M9) forms the current Ix+(N+3)kIx drawn through current mirror input transistor M13. This is mirrored as the output current Ix+(N+3)kIx through transistor M14 which, in turn, is filtered by a low-pass filter circuit composed of an input shunt capacitor Cf1, a series resistor Rf and an output shunt capacitor Cf2.

The filtered version of this current Ix+(N+3)kIx provides the supply current for transistors M3, M4, M10, M11 and M12. Transistor M11, which is the input transistor for the current mirror circuit formed by transistors M10–M12, is controlled by the output of the voltage-to-current conversion circuit M1–M5 (discussed in more detail below) and establishes a current kIx for itself and, therefore, a similar current kIx for transistor M10 and a current (N+1)kIx for transistor M12 (which has a channel width of (N+1) times the channel width of transistor M11). The current (N+1)kIx provided by transistor M12 provides each of the supply currents kIx for the DDLs within the ICO plus the supply current kIx for the reference DDL (DDLR).

As noted above, transistor M5 establishes a tail current Ix for the voltage-to-current conversion circuit M1–M5. This current Ix is split into two currents kIx, (1−k)Ix within the two circuit branches of the voltage-to-current conversion circuit M1–M5. The factor k, and, therefore, the relative magnitudes of the branch currents kIx, (1−k)Ix, is determined by the relative magnitudes of the noninverting Vf+ and inverting Vf− phases of the differential frequency control voltage Vf used for determining the frequency of the clock signal CLOCK from the ICO.

As noted above, transistor M14 produces the supply current Ix+(N+3)kIx for the VCO circuit. Therefore, the op amp OPAK is not required to provide significant load current, if any at all. The low-pass filter Cf1, Rf, Cf2 is used to provide further power supply noise reduction, with the input filter capacitor Cf1 having the most effect. The type of op amp OPAK used plays an important role in determining the amount of power supply noise reduction.

Figure 2:
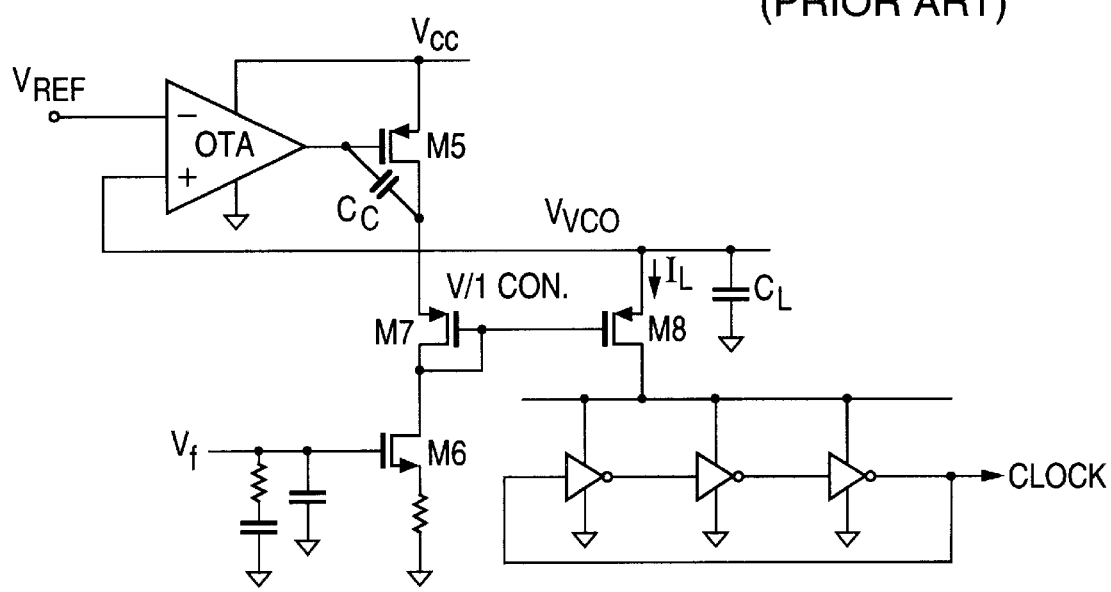
FIG. 2 is a circuit diagram of a conventional voltage regulator circuit for a voltage controlled oscillator (VCO).
Figure 3:
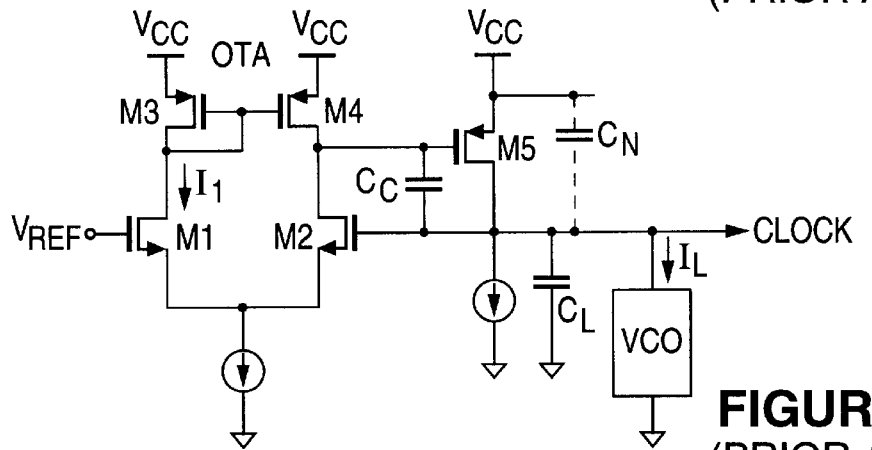
FIG. 3 is a circuit diagram for the circuit of FIG. 2 in which the operational amplifier (op amp) is shown in more detail.

One possible implementation is a simple differential pair with an active load, such as that shown in FIGS. 2 and 3. However, while simple, this has a number of disadvantages. For example, the output voltage range is limited. Once the output voltage becomes lower than the inverting input signal, one of the input transistors is forced into its triode region of operation. Another problem is high offset voltage. When the output voltage approaches ground potential, the transconductance of the output transistor M4 increases. The resulting increase in drain current for transistor M2 must then be achieved by an increased input offset voltage.

Figure 6:
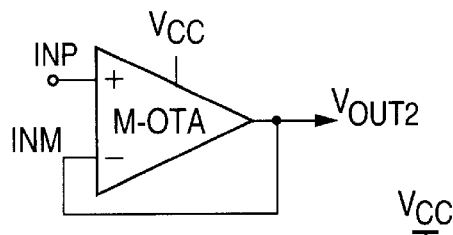
FIG. 6 is a circuit diagram of a conventional circuit implementation of the op amp in the circuits of FIGS. 4 and 5.
Figure 6:
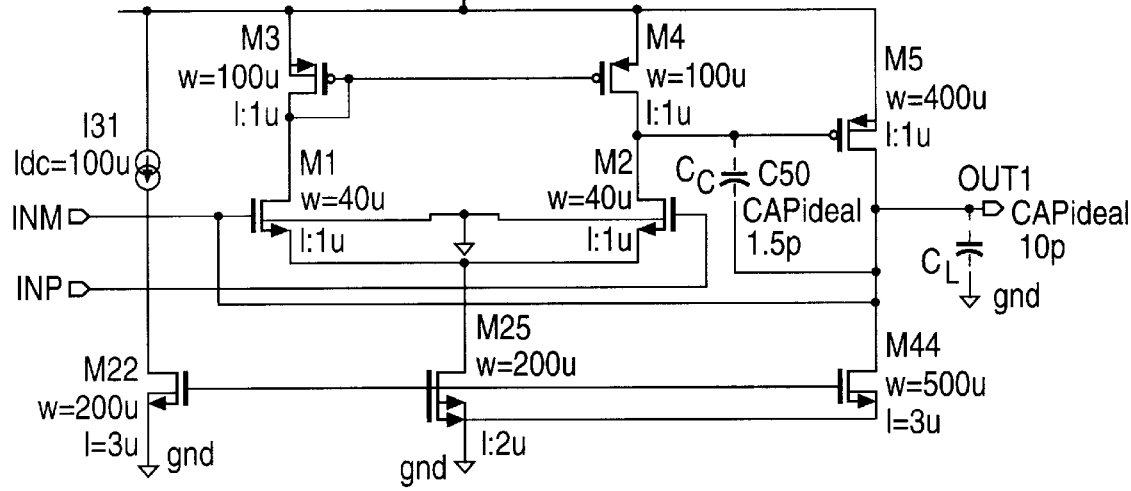

Referring to FIG. 6, another possible implementation is a Miller-effect-compensated op amp (M-OTA) as shown. One disadvantage of this implementation is poor power supply rejection due to the need for a compensation capacitance $C_C$ at the output transistor M5. As indicated below in Equations 11–15, the power supply rejection V01/Vcc includes a low frequency zero Z1 at approximately 25 Khz which is caused by this compensation capacitor $C_C$. Following this zero Z1, the power supply induced noise continues to increase at a rate of 20 decibels per decade until the frequency reaches the first pole P1 at approximately 70 Mhz. At very high frequencies, this power supply rejection V01/Vcc becomes approximately −3.5 decibels. Since the ratio of the compensation capacitance $C_C$ to the load capacitance $C_L$ has a minimum value of 0.22, high frequency noise reduction cannot be obtained by raising the value of the load capacitance $C_L$.

$$\frac{V_{OUT1}}{Vcc} = \frac{1}{Avo} \frac{s/Z1+1}{(s/P1+1)(s/P2+1)} \tag{11}$$

$$\frac{1}{Avo} = \frac{g_{o24}g_{o5}}{g_{M2}g_{M5}} \approx -68 \text{ dB} \tag{12}$$

$$Z1 = \frac{1}{2\pi} \frac{g_{o24}}{g_{M5}(1/g_{o5})C_C} \approx 25 \text{ KHz} \tag{13}$$

$$P1 = \frac{1}{2\pi} \frac{g_{M2}}{C_C} \approx 70 \text{ MHz} \tag{14}$$

$$P2 = \frac{1}{2\pi} \frac{g_{M5}}{C_L} \approx 197 \text{ MHz} \tag{15}$$

Figure 7:
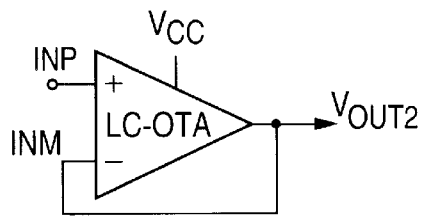
FIG. 7 is a circuit diagram of another conventional circuit implementation of the op amp in the circuits of FIGS. 4 and 5.
Figure 7:
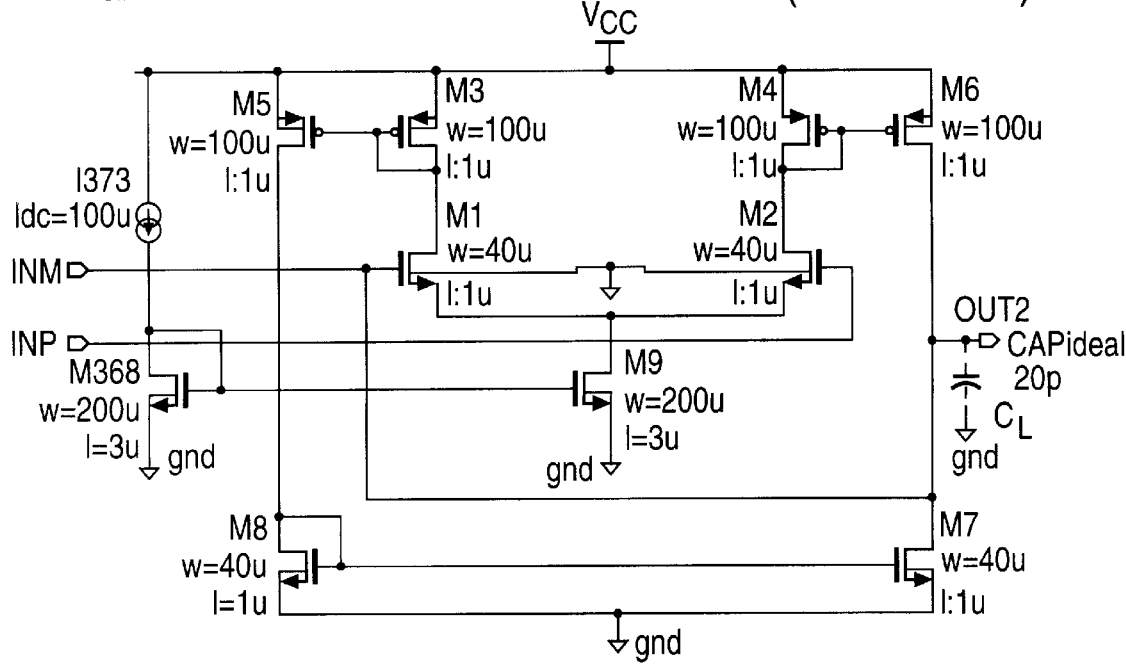

Referring to FIG. 7, still another possible implementation is a load-compensated op amp (LC-OTA). The above-noted disadvantages of the basic op amp are overcome by adding two additional current mirrors. This allows a rail-to-rail output voltage range to be obtained, along with a higher frequency response bandwidth and significantly improved power supply rejection. As indicated below in Equations 16–19, the power supply rejection Vout2/Vcc has a pole P of approximately 10 Mhz that forces the power supply noise Vout2 to decrease until it approaches the zero Z of approximately 160 Mhz. Since the power supply rejection Vout2/Vcc is inversely proportional to the load capacitance $C_L$ at very high frequencies, any increases in the load capacitance $C_L$ further reduce any power supply noise at the output Vout2.

$$\frac{V_{OUT2}}{Vcc} = \left(\frac{1}{Avo1} - \frac{1}{Avo2}\right)\left(\frac{s/Z+1}{s/P+1}\right) \tag{16}$$

-continued $$\frac{1}{Avo1} - \frac{1}{Avo2} = \frac{g_{06} - g_{05}}{g_{MI}} \approx -34 \text{ dB} \quad (17)$$

$$P = \frac{g_{MI}}{2\pi C_L} \approx 10 \text{ MHz} \quad (18)$$

$$Z = \frac{g_{06} - g_{05}}{2\pi (C_{06} - C_{05})} \approx 160 \text{ Mhz} \quad (19)$$

Figure 8:
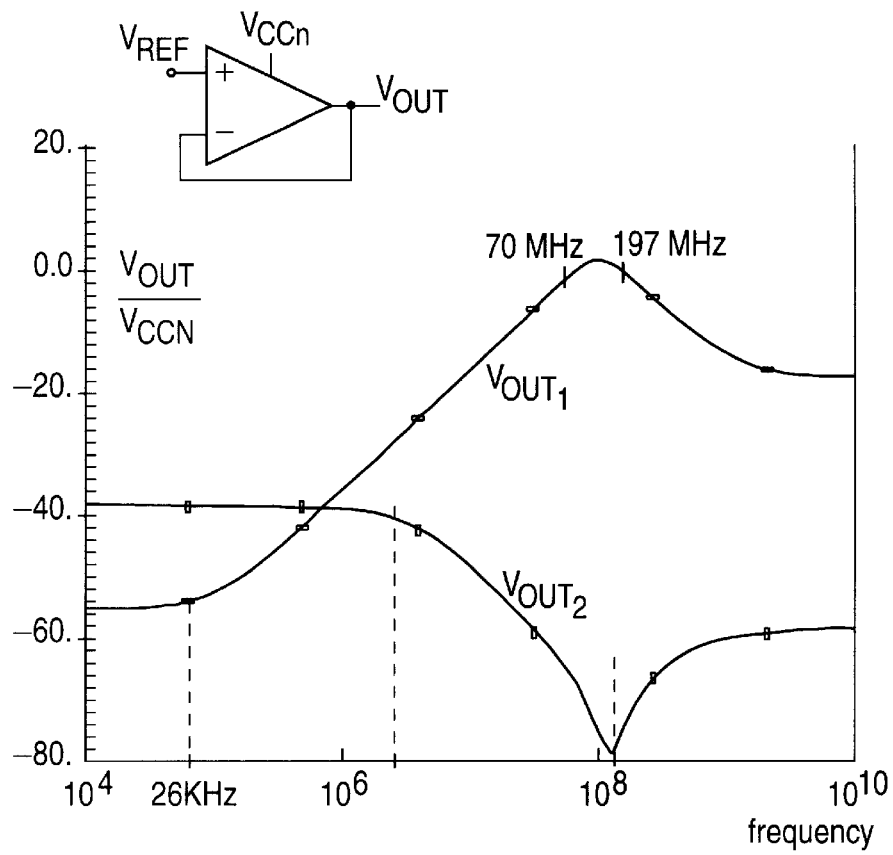
FIG. 8 is an amplitude-versus-frequency plot illustrating the power supply rejection performances of the op amp in the circuits of FIGS. 6 and 7.

Referring to FIG. 8, the power supply rejection performances of the M-OTA and LC-OTA amplifiers were simulated. As indicated, over medium and high frequency ranges, the LC-OTA amplifier has power supply rejection that is approximately 40 decibels better than the M-OTA amplifier. Accordingly, the LC-OTA amplifier is the preferred choice for the op amp OPAK in the circuit of FIG. 5.

Figure 10:
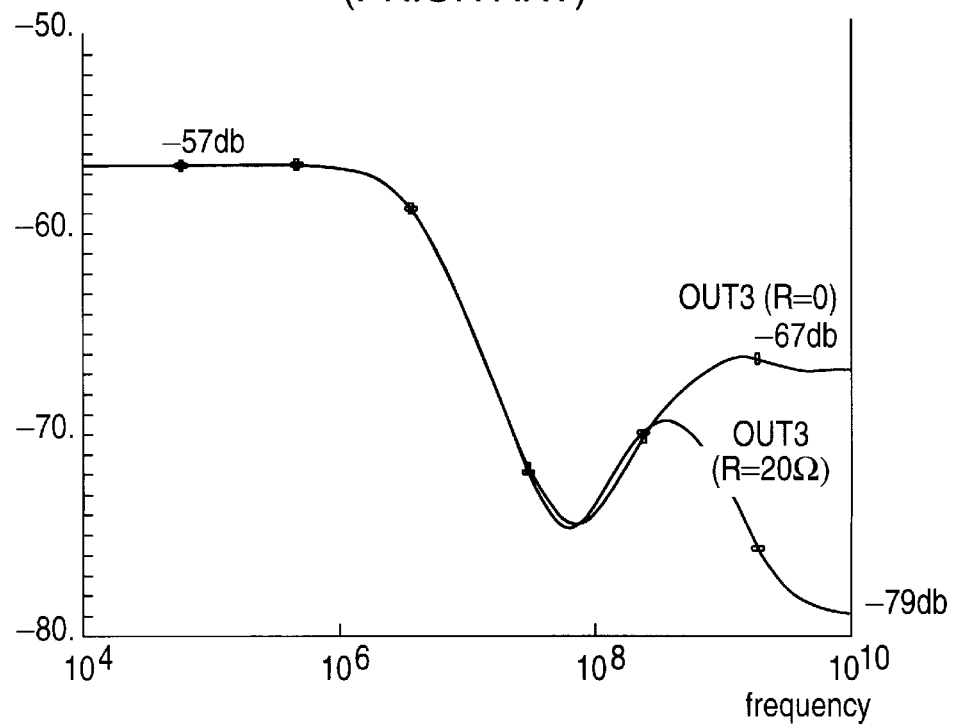
FIG. 10 is an amplitude-versus-frequency plot of the power supply rejection performance of the circuit of FIG. 9.
Figure 9:
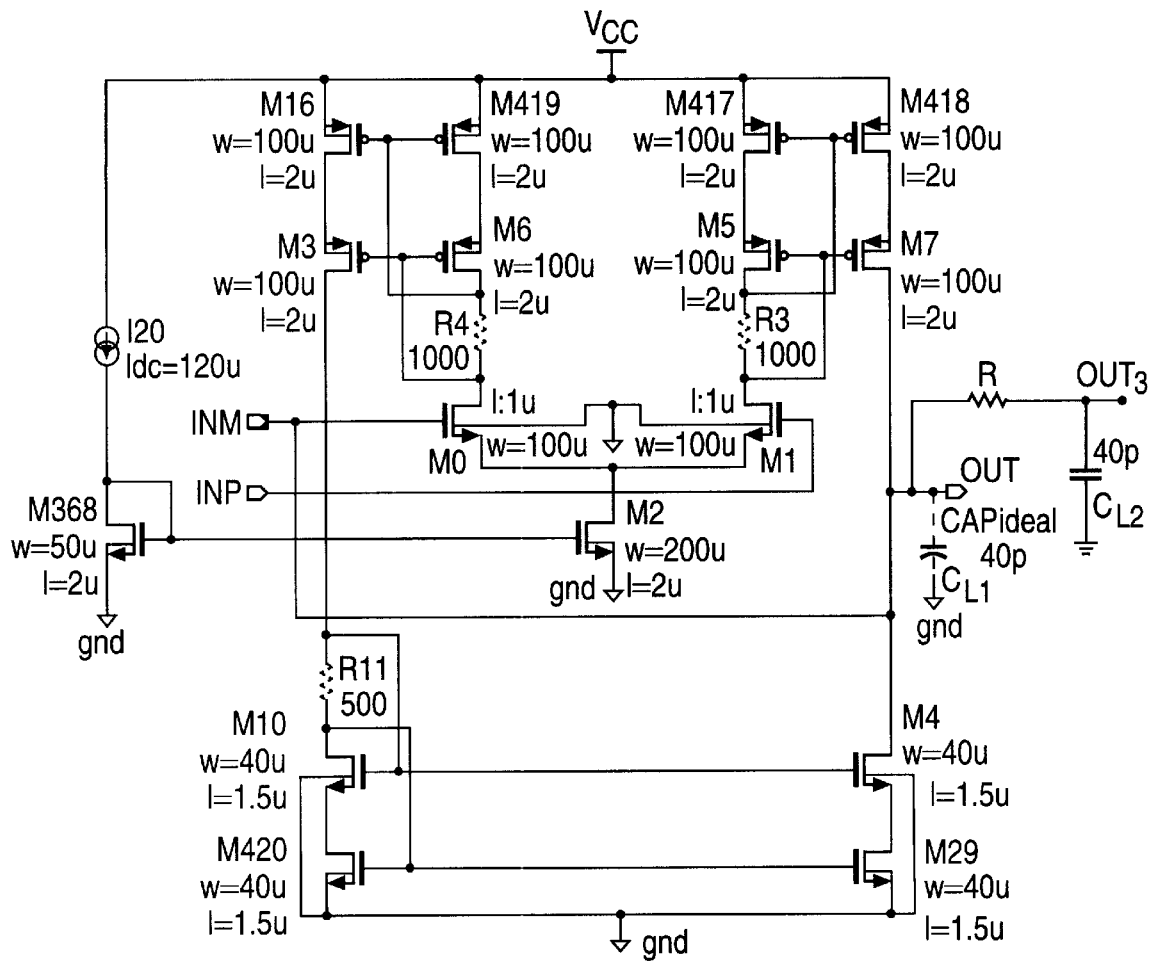
FIG. 9 is a circuit diagram of an alternative circuit implementation of the op amp in the circuits of FIGS. 4 and 5.

Referring to FIG. 9, since the power supply rejection increases with the output impedances of transistors M5 and M6 of LC-OTA (FIG. 7), the cascode output stage is implemented as a modified load-compensated amplifier (MLC-OTA) as shown. Its power supply rejection performance is shown in FIG. 10. When compared to the LC-OTA amplifier, the power supply rejection of the MLC-OTA amplifier is approximately 20 decibels greater. Accordingly, the MLC-OTA amplifier is the preferred circuit configuration. Also, as indicated, to further improve the power supply noise reduction, a filter resistor R is inserted between the two split load capacitances $C_{L1}$, $C_{L2}$. As shown in FIG. 10, power supply rejection at high frequencies is 10 decibels greater with a resistance R of 20 ohms as compared to a resistance R of zero ohms.

Figure 11A:
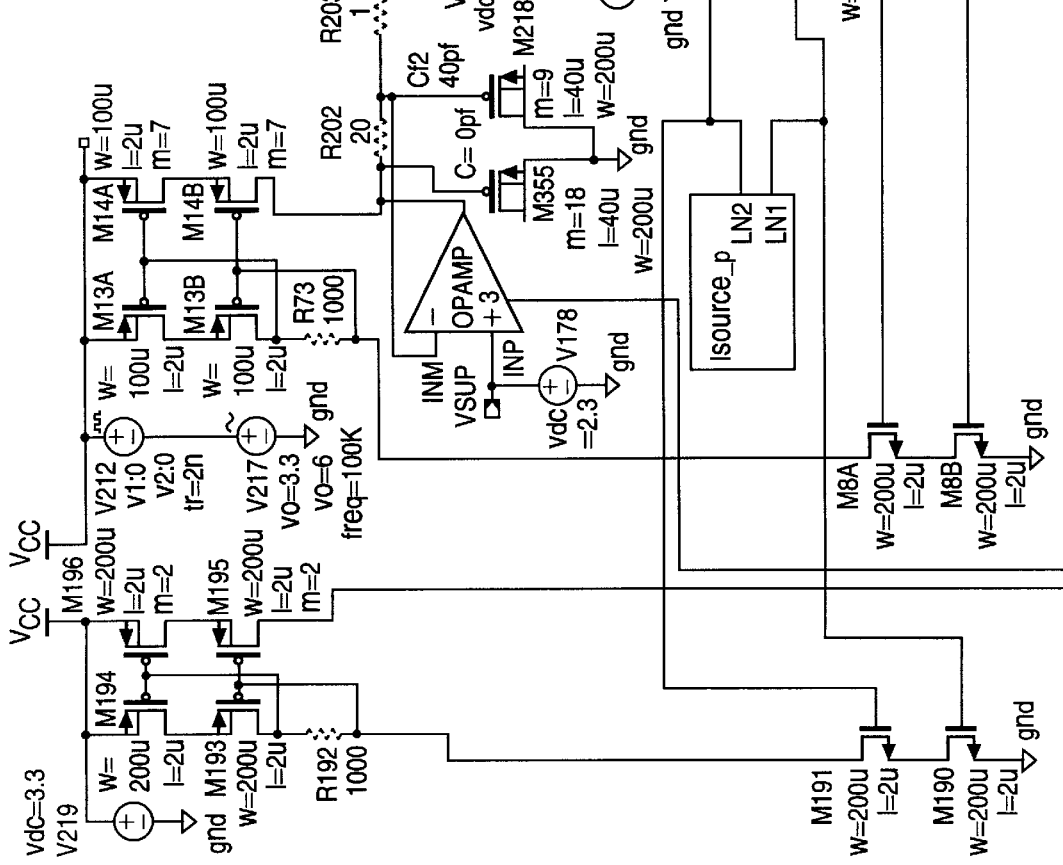
FIG. 11 is a circuit diagram of a power supply regulator circuit used for regulating the power supply voltage of a VCO in accordance with still another embodiment of the present invention.
Figure 11B:
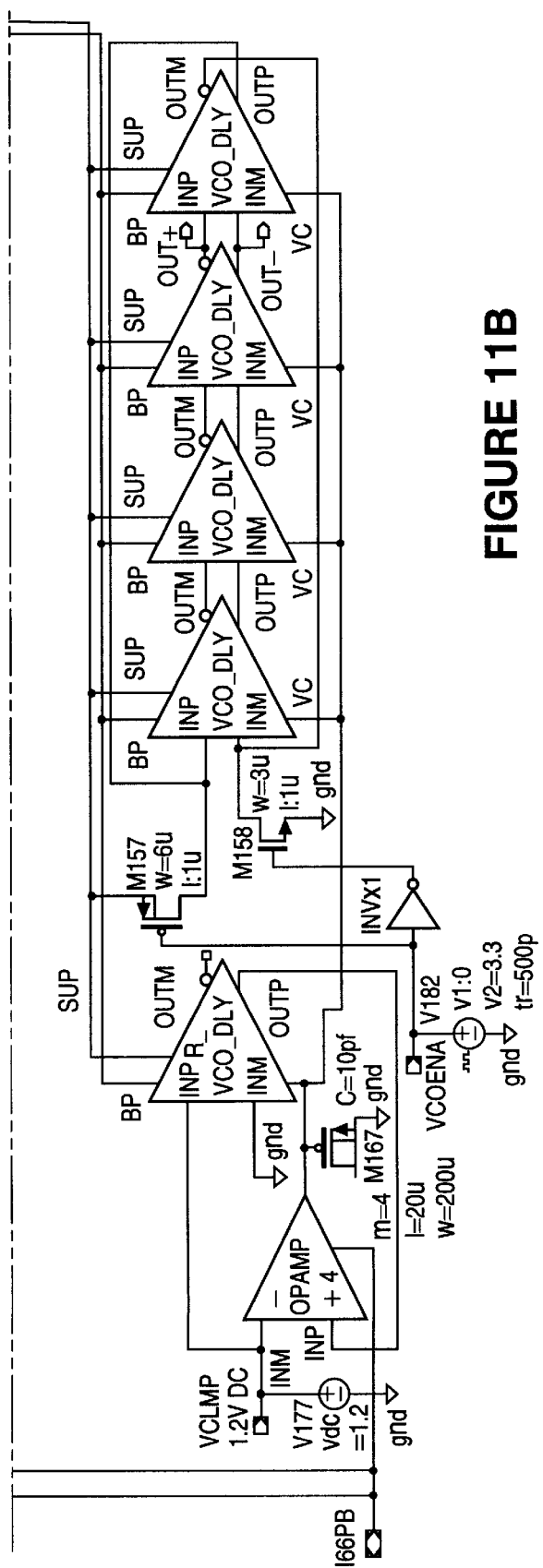

Referring to FIG. 11, a more complete and detailed implementation of the circuit of FIG. 5 is shown. The voltage-to-current conversion circuit is formed with transistors M1–M4, while op amp OPAMP3 serves as the op amp OPAK providing power supply voltage regulation. Resistor R202 (20 ohms) and filter capacitor Cf2 (40 pf) provide additional high frequency noise reduction. The VCO consists of four differential delay line cells VCO_DLY, plus one replica delay line cell R_VCO_DLY along with op amp OPAMP4 used to bias the five delay line cells so that the VCO output voltage swings between the clamp of voltage VCLMP of 1.2 volts and circuit ground potential.

Figure 12:
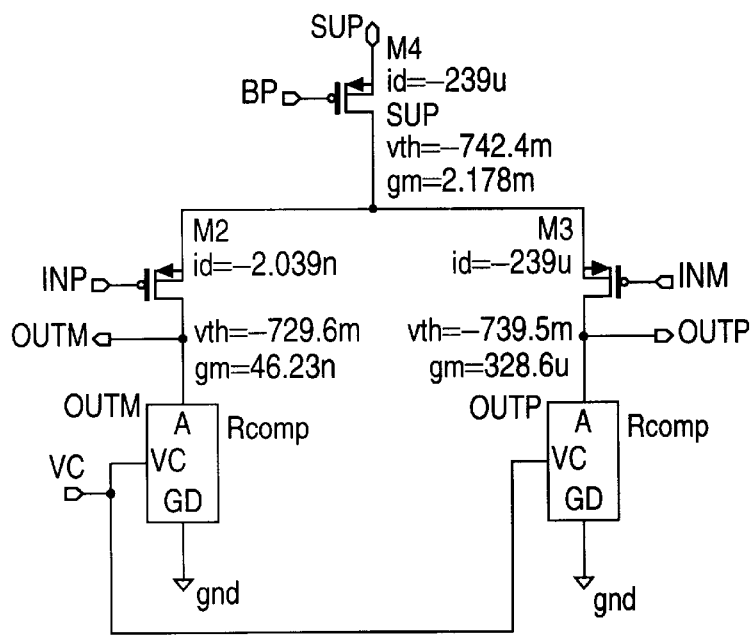
FIG. 12 is a circuit diagram of a circuit implementation of the inverters forming the VCO in the circuit of FIG. 11.

Referring to FIG. 12, the VCO delay line cells VCO_DLY can each be implemented as shown.

Figure 13:
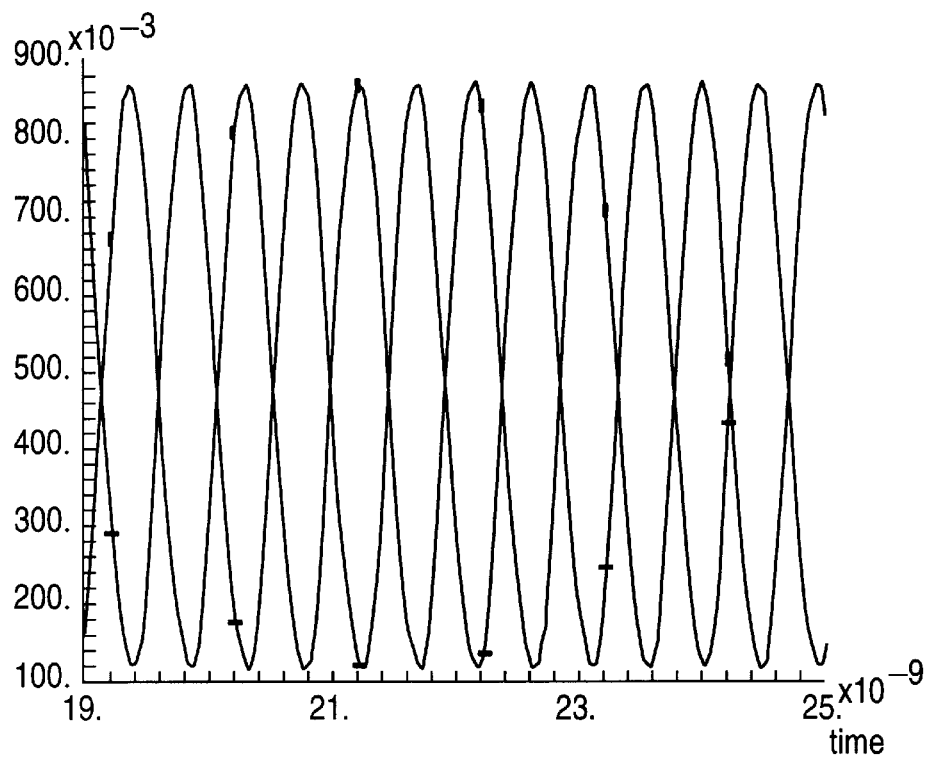
FIG. 13 is an amplitude-versus-time plot of a simulation for the performance of the circuit of FIG. 11.
Figure 14:
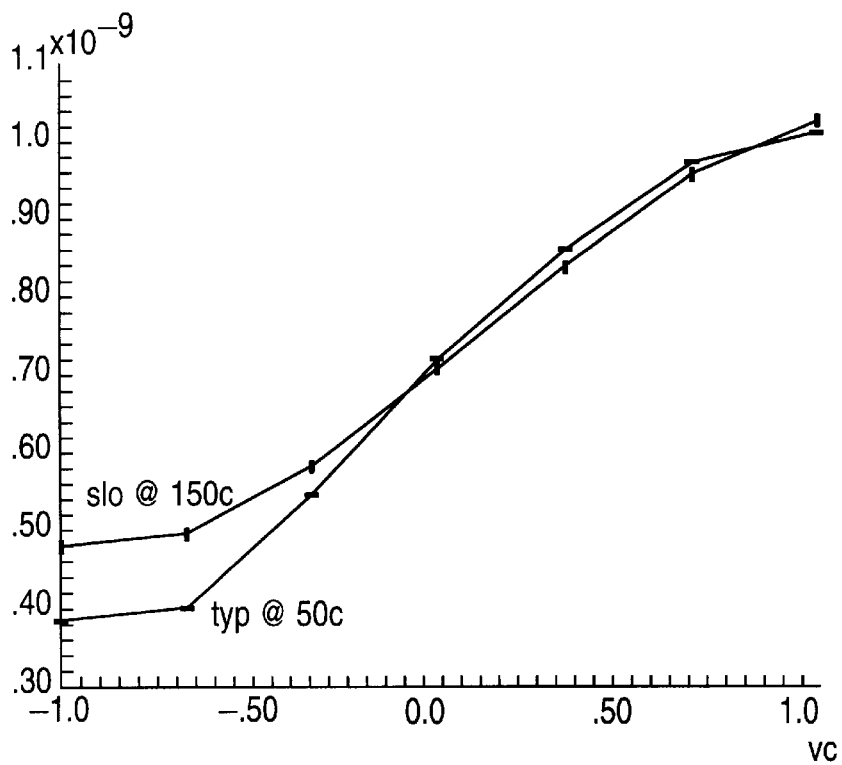
FIG. 14 is a graph of the VCO transfer characteristics for the circuit of FIG. 11.

Referring to FIGS. 13 and 14, the circuit of FIG. 11 was simulated using 0.35 micron device models. FIG. 13 shows the two complementary outputs OUT+, OUT− with typical device models running at approximately 150° C. FIG. 14 shows the VCO transfer characteristics (frequency versus differential input voltage), with a substantially linear transfer function over the range of 500 Mhz to 1000 Mhz and with virtually no sensitivity to device model or temperature.

Figure 15:
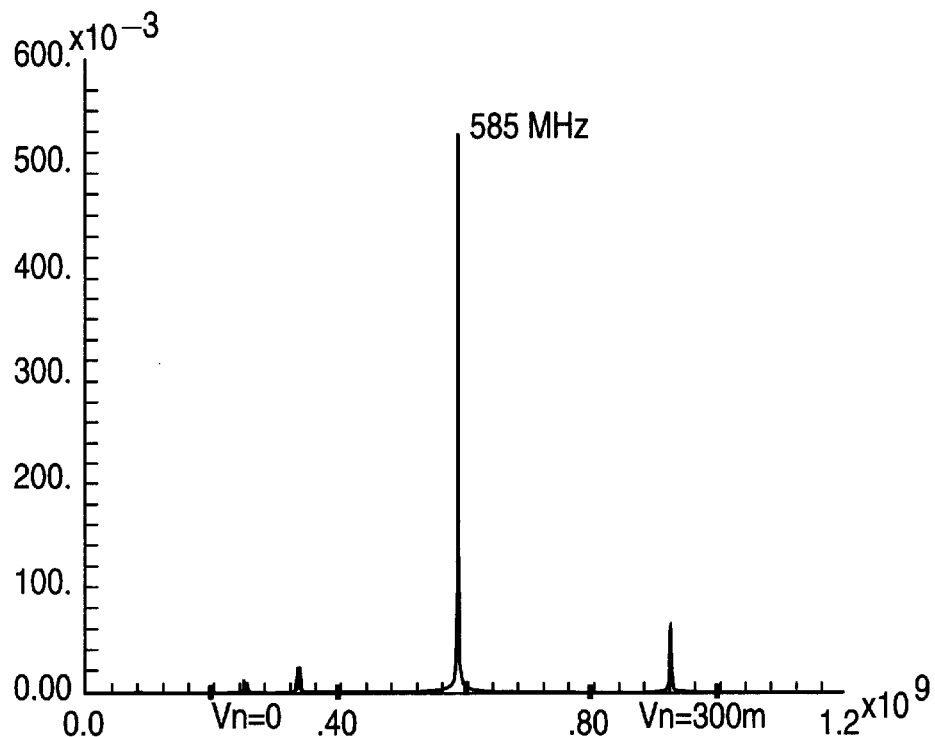
FIG. 15 is a graph of the frequency spectrum for the output of the VCO of the circuit of FIG. 11.
Figure 16:
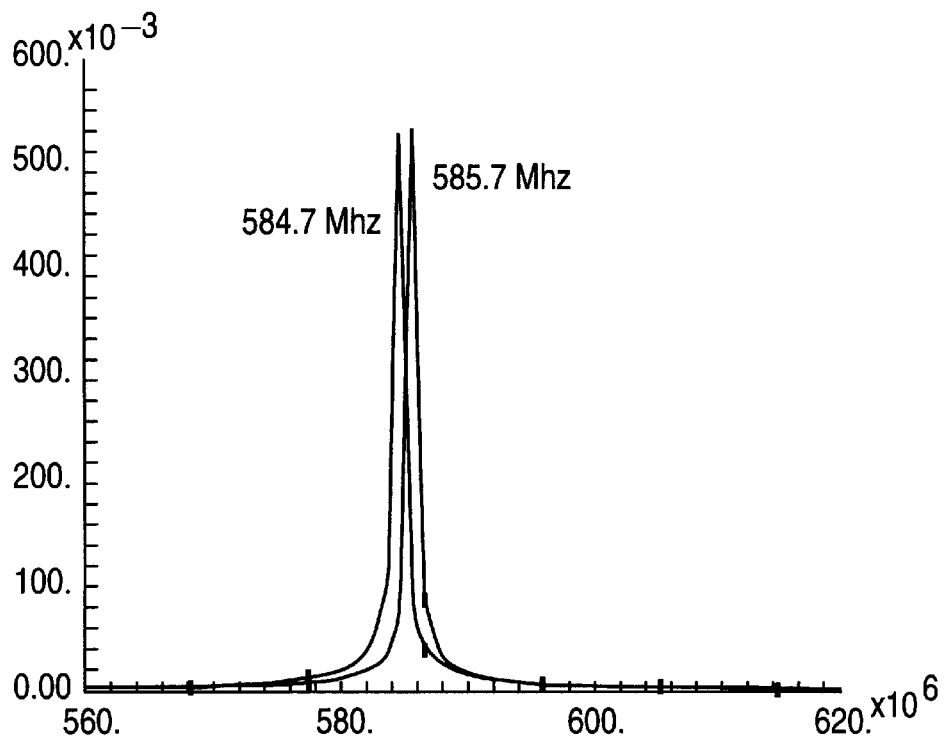
FIG. 16 is an expanded view of the graph of FIG. 15.

Referring to FIGS. 15, 16, 17A–17C, 18A–18C and 19A–19C, power supply noise rejection performance was simulated by injecting a 10 Mhz, 300 millivolt square wave pulse into the supply voltage Vcc. FIG. 15 shows the frequency spectra of the VCO output. For this simulation, it has a peak frequency of approximately 585 Mhz. FIG. 16 is an expanded view of FIG. 15, and indicates that the free running VCO frequency of 584.7 Mhz shifts by only 1 Mhz without any noise side-band frequencies caused by the injected supply noise. This 1 Mhz shift in frequency was caused by a small increase in the regulated DC voltage but will be corrected when the VCO is used in a true closed loop PLL circuit.

Figure 17A:
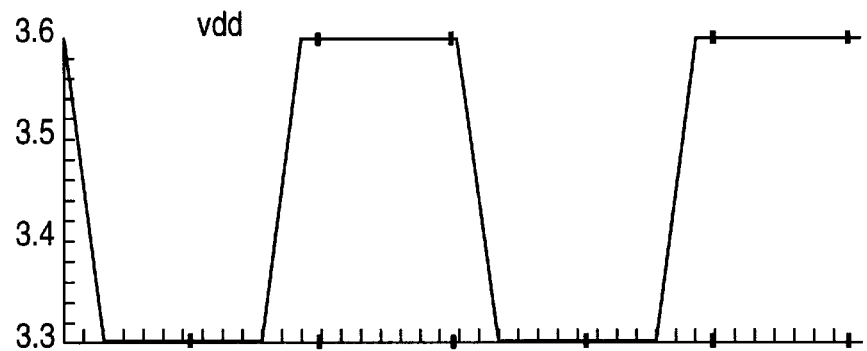
FIGS. 17A–17C, 18A–18C and 19A–19C are amplitude-versus-time plots of simulations of the performance of the circuit of FIG. 11 with various types of noise injected into the raw power supply voltage.
Figure 17B:
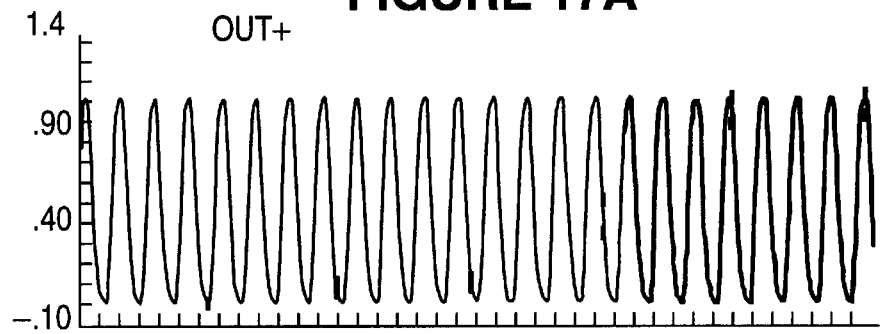
Figure 17C:
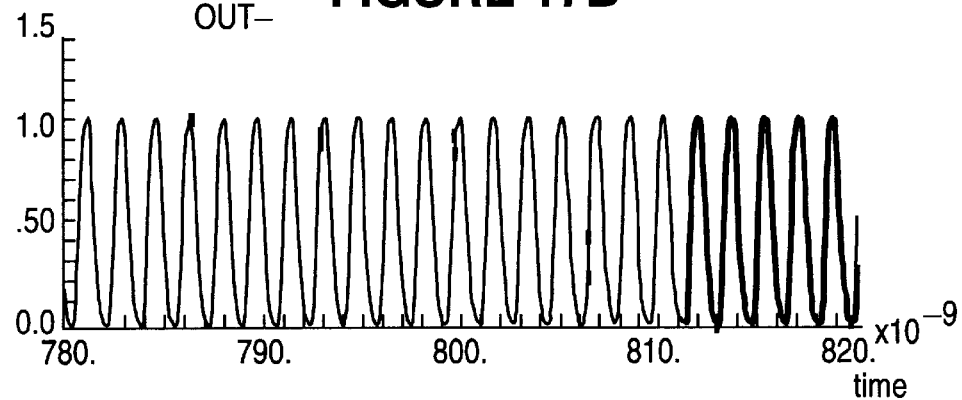
Figure 18A:
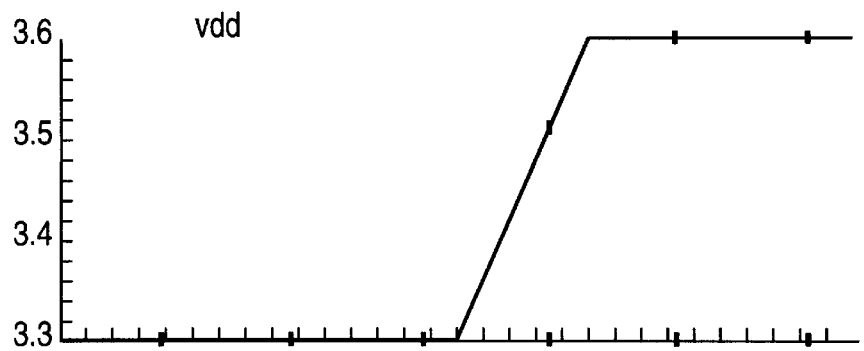
Figure 18B:
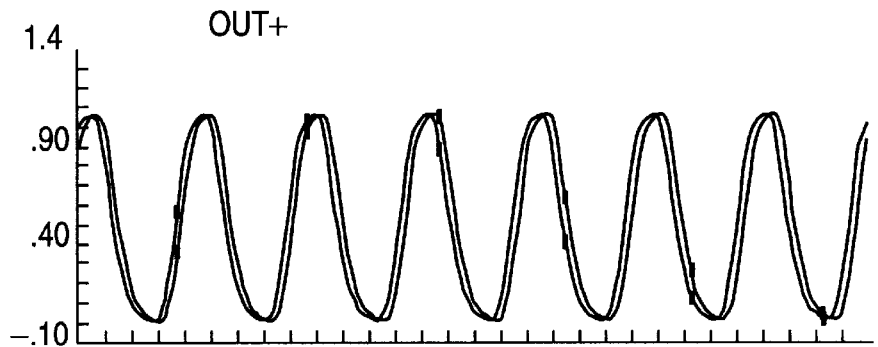
Figure 18C:
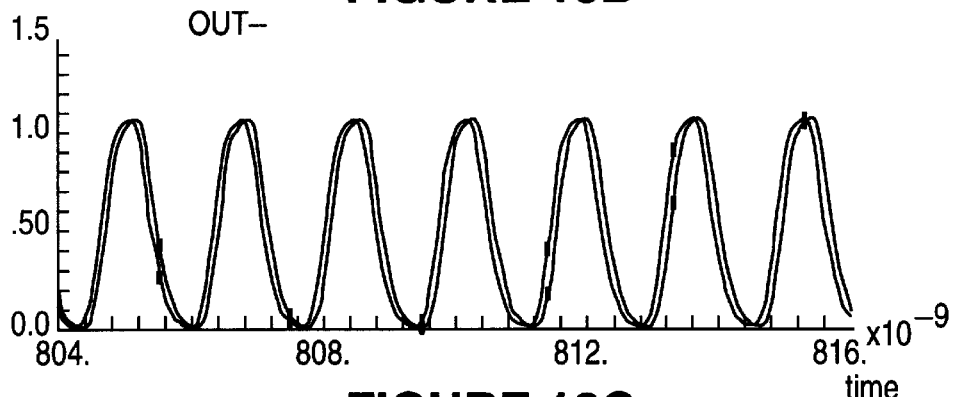
Figure 19A:
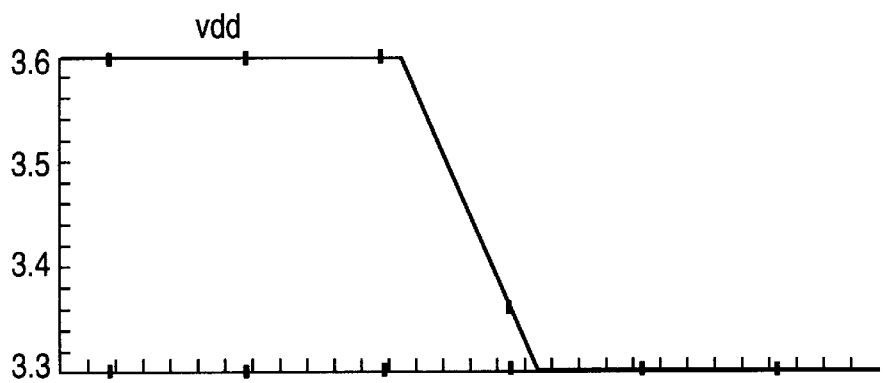
Figure 19B:
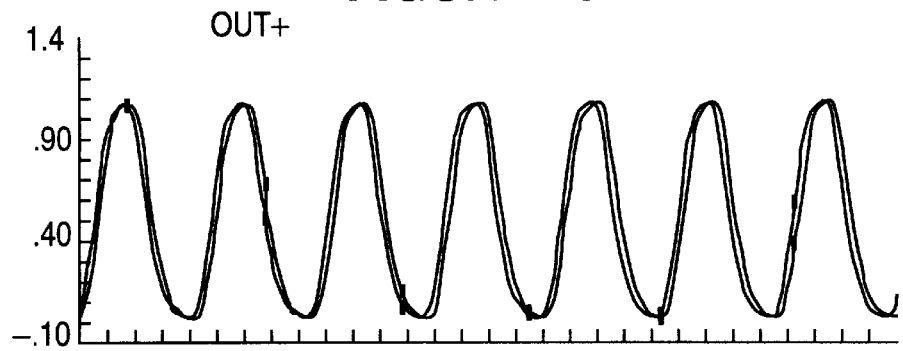
Figure 19C:
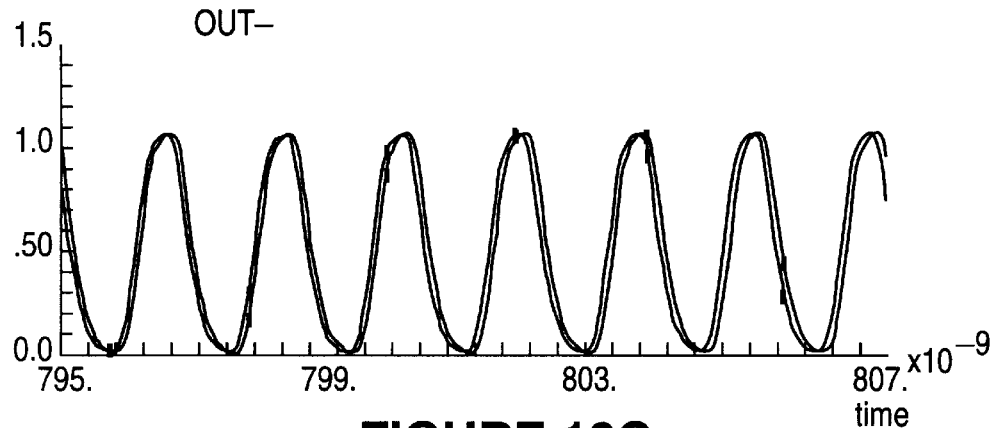

FIG. 17A illustrates the injected noise voltage for this simulation, while FIGS. 17B and 17C illustrate the resulting output voltage wave forms for the noninverting OUT+ and inverting OUT− phases of the output clock signal, respectively. FIGS. 18A–18C correspond to FIGS. 17A–17C and are expanded to illustrate the signals due to the leading edge of the injected noise voltage. FIGS. 19A–19C correspond to FIGS. 17A–17C and are expanded to illustrate the signals due to the trailing edge of the injected noise voltage. As noted earlier, the offset signal traces in FIGS. 17B, 17C, 18B and 18C will merge when the VCO is used in a true closed loop PLL circuit.

Figure 20:
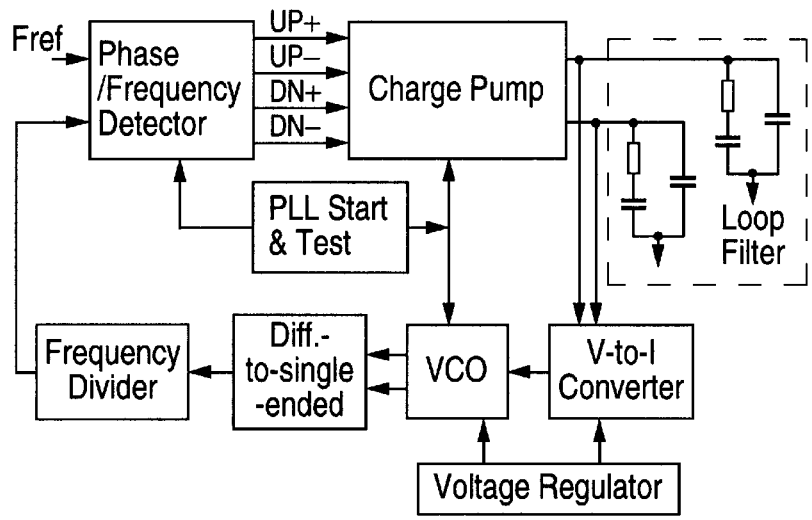
FIG. 20 is a functional block diagram of a PLL using a power supply regulator circuit for regulating the power supply voltage of the VCO in accordance with the present invention.
Figure 21:
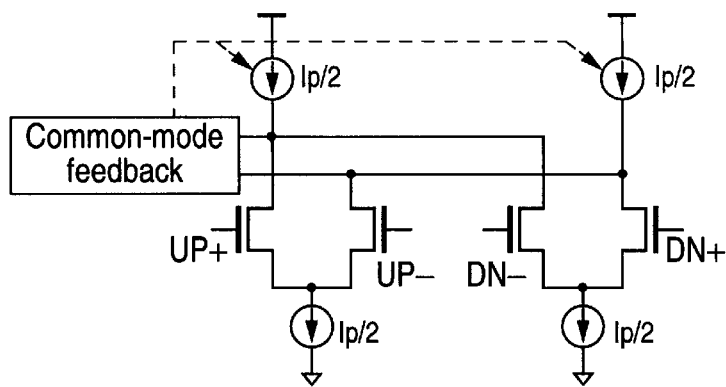
FIG. 21 is a circuit diagram of the differential charge pump circuit used in the circuit of FIG. 20.
Figure 22:
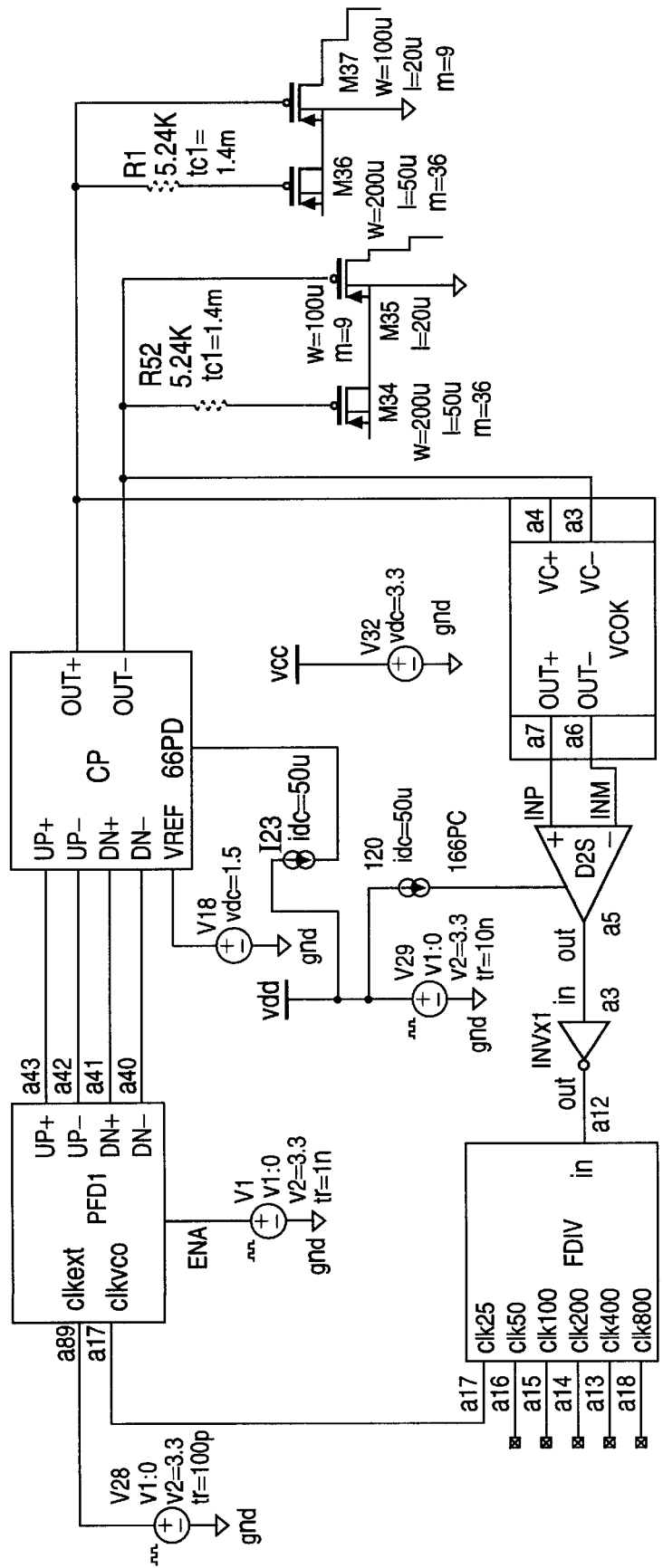
FIG. 22 is a circuit diagram of a circuit used for simulating the performance of a voltage regulator circuit regulating the power supply voltage of a VCO in accordance with the present invention.

Referring to FIG. 20, the power supply regulator and VCO circuits discussed above are particularly suitable for use in a PLL circuit, with a differential charge pump circuit, as represented in FIG. 21. The phase/frequency detector is a conventional three-state, dual D-type flip-flop circuit with up and down signals that are converted into complementary signals UP+/UP−, DN+/DN− for driving the differential charge pump. The charge pump uses cross-coupled differential pairs to steer the current for charging or discharging the loop filter. A more detailed representation of this circuit implementation is shown in FIG. 22.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a power supply regulator circuit with increased rejection of variations and noise in power supply voltage, comprising:

a power supply terminal configured to couple to a power supply and convey therefrom a supply voltage and a supply current;

a regulated circuit terminal configured to convey a regulated voltage and a first current;

a current replication circuit, coupled between said power supply and regulated circuit terminals, configured to receive said supply voltage, said supply current and said regulated voltage and in accordance therewith provide said first current and a second current, wherein said first and second currents are substantially mutually proportional; and a voltage buffer circuit, coupled to said regulated circuit terminal, configured to receive and buffer a reference voltage and in accordance therewith provide said regulated voltage;

wherein variations and noise in said supply voltage appear as differences between said supply and regulated voltages across said current replication circuit and are thereby substantially prevented from appearing in said regulated voltage.

2. The apparatus of claim 1, wherein said current replication circuit comprises a current mirror circuit.

3. The apparatus of claim 1, wherein said current replication circuit comprises:

an input circuit branch, coupled to said power supply terminal, configured to receive a first portion of said supply current and in accordance therewith provide a bias voltage and said second current; and an output circuit branch, coupled to said power supply terminal, said input circuit branch and said regulated circuit terminal, configured to receive a second portion of said supply current, said bias voltage and said regulated voltage and in accordance therewith provide said first current.

4. The apparatus of claim 1, wherein said voltage buffer circuit comprises a voltage follower circuit.

5. The apparatus of claim 1, wherein said voltage buffer circuit comprises an operational amplifier circuit.

6. The apparatus of claim 1, further comprising a filter circuit, coupled to said regulated circuit terminal, configured to receive and filter said regulated voltage and in accordance therewith provide a filtered voltage.

7. The apparatus of claim 1, further comprising a voltage-controlled oscillator circuit, coupled to said regulated circuit terminal, configured to receive said regulated voltage, said first current and a control voltage and in accordance therewith provide an oscillator signal with a frequency that varies in relation to said control voltage.

8. The apparatus of claim 7, wherein said voltage-controlled oscillator circuit comprises:
a voltage-to-current conversion circuit, coupled to said current replication circuit, configured to receive said control voltage and in accordance therewith conduct said first and second currents and in accordance therewith provide a third current that varies in relation to said control voltage; and
a current-controlled oscillator circuit, coupled to said voltage-to-current conversion circuit, configured to receive said third current and in accordance therewith provide said oscillator signal, wherein said oscillator signal frequency varies in relation to said third current.

9. The apparatus of claim 8, wherein said voltage-to-current conversion circuit comprises:
a voltage-to-current amplifier circuit configured to receive said control voltage, a portion of said first current and a portion of said second current and in accordance therewith provide a bias signal; and
a current mirror circuit, coupled to said voltage-to-current amplifier circuit, configured to receive another portion of said first current, another portion of said second current and said bias signal and in accordance therewith provide said third current.

10. The apparatus of claim 8, wherein said current-controlled oscillator circuit comprises a ring oscillator circuit.

11. An apparatus including a voltage-controlled oscillator with increased rejection of variations and noise in power supply voltage, comprising:
a power supply terminal configured to couple to a power supply and convey therefrom a supply voltage and a supply current;
a regulated circuit terminal configured to convey a regulated voltage and a first current;
a first current mirror circuit, coupled between said power supply and regulated circuit terminals, configured to receive said supply voltage, said supply current and said regulated voltage and in accordance therewith provide said first current and a second current, wherein said first and second currents are substantially mutually proportional;

a voltage buffer circuit, coupled to said regulated circuit terminal, configured to receive and buffer a reference voltage and in accordance therewith provide said regulated voltage; and
a voltage-controlled oscillator circuit, coupled to said regulated circuit terminal, configured to receive said regulated voltage, said first current and a control voltage and in accordance therewith provide an oscillator signal with a frequency that varies in relation to said control voltage;
wherein variations and noise in said supply voltage appear as differences between said supply and regulated voltages across said current mirror circuit and are thereby substantially prevented from appearing in said regulated voltage.

12. The apparatus of claim 11, wherein said first current mirror circuit comprises:
an input circuit branch, coupled to said power supply terminal, configured to receive a first portion of said supply current and in accordance therewith provide a bias voltage and said second current; and
an output circuit branch, coupled to said power supply terminal, said input circuit branch and said regulated circuit terminal, configured to receive a second portion of said supply current, said bias voltage and said regulated voltage and in accordance therewith provide said first current.

13. The apparatus of claim 11, wherein said voltage buffer circuit comprises a voltage follower circuit.

14. The apparatus of claim 11, wherein said voltage buffer circuit comprises an operational amplifier circuit.

15. The apparatus of claim 11, wherein said voltage-controlled oscillator circuit comprises:
a filter circuit configured to receive and filter said regulated voltage and in accordance therewith provide a filtered voltage;
a voltage-to-current conversion circuit, coupled to said filter circuit, configured to receive said filtered voltage and said control voltage and in accordance therewith conduct said first and second currents and in accordance therewith provide a third current that varies in relation to said control voltage; and
a current-controlled oscillator circuit, coupled to said voltage-to-current conversion circuit, configured to receive said third current and in accordance therewith provide said oscillator signal, wherein said oscillator signal frequency varies in relation to said third current.

16. The apparatus of claim 15, wherein said voltage-to-current conversion circuit comprises:
a voltage-to-current amplifier circuit configured to receive said control voltage, a portion of said first current and a portion of said second current and in accordance therewith provide a bias signal; and
a second current mirror circuit, coupled to said voltage-to-current amplifier circuit, configured to receive another portion of said first current, another portion of said second current and said bias signal and in accordance therewith provide said third current.

17. The apparatus of claim 16, wherein said current-controlled oscillator circuit comprises a ring oscillator circuit.

* * * * *